(12) United States Patent
Zang et al.

(10) Patent No.: US 10,607,893 B2
(45) Date of Patent: Mar. 31, 2020

(54) MIDDLE OF LINE STRUCTURES

(71) Applicant: GLOBALFOUNDRIES INC., Grand Cayman (KY)

(72) Inventors: Hui Zang, Guilderland, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/898,569

(22) Filed: Feb. 17, 2018

(65) Prior Publication Data

US 2019/0259667 A1 Aug. 22, 2019

(51) Int. Cl.
*H01L 21/8234* (2006.01)
*H01L 29/08* (2006.01)
*H01L 29/66* (2006.01)
*H01L 27/088* (2006.01)

(52) U.S. Cl.
CPC .... *H01L 21/823475* (2013.01); *H01L 27/088* (2013.01); *H01L 29/0847* (2013.01); *H01L 29/6656* (2013.01)

(58) Field of Classification Search
CPC ............ H01L 29/66795; H01L 29/785; H01L 2924/0002; H01L 29/41791; H01L 29/0847; H01L 29/66545; H01L 27/0886; H01L 21/823431
USPC .......................................... 257/401; 438/283
See application file for complete search history.

(56) References Cited

U.S. PATENT DOCUMENTS

| 5,924,010 | A | 7/1999 | Chen et al. |
| 6,153,485 | A | 11/2000 | Pey et al. |
| 6,429,493 | B1 | 8/2002 | Asahina et al. |
| 8,791,509 | B2* | 7/2014 | Beyer ............... H01L 29/41791 257/288 |
| 9,691,897 | B2 | 6/2017 | Xie et al. |
| 2007/0099414 | A1* | 5/2007 | Frohberg .......... H01L 21/76877 438/618 |
| 2008/0087966 | A1* | 4/2008 | Tai .................. H01L 21/823842 257/369 |
| 2011/0057317 | A1 | 3/2011 | Koike et al. |

(Continued)

FOREIGN PATENT DOCUMENTS

| DE | 10258761 | 1/2004 |
| DE | 112011101069 | 5/2018 |

OTHER PUBLICATIONS

Office Action dated Nov. 12, 2018 for related DE Application No. 102018208546.3, 18 pages.

(Continued)

*Primary Examiner* — Jonathan Han

(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to middle of line structures and methods of manufacture. The structure includes: a plurality of gate structures comprising source and drain regions; contacts connecting to the source and drain regions; contacts connecting to the gate structures which are offset from the contacts connecting to the source and drain regions; and interconnect structures in electrical contact with the contacts of the gate structures and the contacts of the source and drain regions.

20 Claims, 11 Drawing Sheets

(56) References Cited

U.S. PATENT DOCUMENTS

| | | | |
|---|---|---|---|
| 2013/0009257 A1* | 1/2013 | Ando | H01L 21/28088 257/411 |
| 2015/0035023 A1* | 2/2015 | Kim | H01L 29/785 257/288 |
| 2015/0364378 A1 | 12/2015 | Xie et al. | |
| 2016/0005731 A1* | 1/2016 | Chen | H01L 27/0629 257/300 |
| 2016/0049394 A1* | 2/2016 | Shin | H01L 27/0886 257/401 |
| 2016/0133721 A1* | 5/2016 | Cai | H01L 29/4958 257/506 |
| 2016/0359009 A1* | 12/2016 | Xie | H01L 29/4232 |
| 2018/0033866 A1* | 2/2018 | Liao | H01L 21/28123 |

OTHER PUBLICATIONS

Taiwanese Office Action dated Jan. 21, 2019 for related TW Application No. 1107116133, 8 pages.

Office Action dated Sep. 9, 2019 for related TW Application No. 107116133, 5 pages.

* cited by examiner

MIDDLE OF LINE STRUCTURES

FIELD OF THE INVENTION

The present disclosure generally relates to semiconductor structures and, more particularly, to middle of line structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of line (BEOL) and middle of line (MOL) metallization features, e.g., interconnects, due to the critical dimension (CD) scaling and process capabilities, as well as materials that are used to fabricate such structures.

For example, to manufacture interconnect structures for source and drain contacts, it is necessary to remove dielectric material which is adjacent to the gate structures. The removal of the dielectric material is provided by an etching process, which also tends to erode the spacer material of the gate structure. That is, the low-k dielectric material used for the spacer or sidewalls of the gate structure can be eroded away in the downstream etching processes used to form the openings for the source and drain contacts. This loss of material will expose the metal material of the gate structure, resulting in a short between the metal material of the gate structure and the metal material used to form the contact, itself.

In current structures, there must be a minimum spacing between the gate structures to avoid shorting between the gate contacts and the source and drain contacts. However, as devices continue to scale downwards, minimum spacing and other design rules become more difficult to achieve in these conventional structures.

SUMMARY

In an aspect of the disclosure, a structure comprises: a plurality of gate structures comprising source and drain regions; contacts connecting to the source and drain regions; contacts connecting to the gate structures which are offset from the contacts connecting to the source and drain regions; and interconnect structures in electrical contact with the contacts of the gate structures and the contacts of the source and drain regions.

In an aspect of the disclosure, a structure comprises: a plurality of gate structures comprising source and drain regions, gate contacts and interconnect structures extending from the gate contacts; at least one source and drain contact at a different height with respect to the gate contacts; and a liner over the source and drain regions, the gate contacts and the at least one source and drain contact.

In an aspect of the disclosure, a method comprises: forming a plurality of gate structures comprising source and drain regions and gate materials; forming an interlevel dielectric layer comprising a sacrificial layer and a dielectric cap over source and drain regions of gate structures; opening a portion of the dielectric cap to expose the sacrificial layer; removing the sacrificial layer to expose the source and drain regions; exposing the gate materials; forming offset metallization features at the same time on the exposed gate materials and the exposed source and drain regions; and forming offset contacts extending from the metallization features.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to middle of line structures and methods of manufacture. In embodiments, the processes and structures provided herein allow for the gate contacts and the source and drain contacts to be offset with respect to each other. Additionally, the processes and structures provided herein allow for the gate contacts and the source and drain contacts to be at different heights with respect to one other. Advantageously, by having offsetting contacts at different heights, shorts are prevented during the fabrication processes between the metallization features of the gate structures and the metallization features of the source and drain regions, i.e., during formation of interconnect structures for the gate contacts and the source and drain contacts. In this way, the structures and processes described herein provide interconnect structures to both the gate contacts and the source and drain contacts without any shorting concerns.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii)

applying a patterned mask on top of the films by photolithographic imaging, and (iii) etching the films selectively to the mask.

Figure 1A:
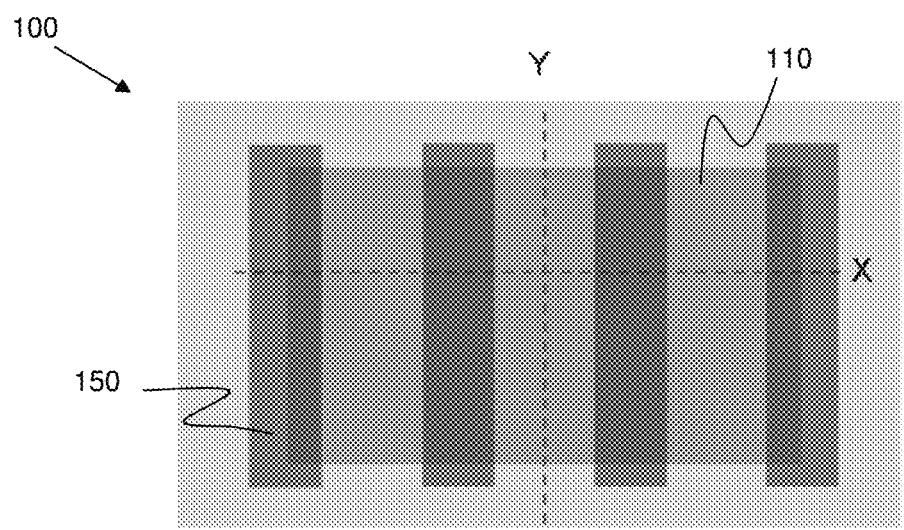
FIGS. 1A-1C show gate structures, amongst other features, and respective fabrication processes in accordance with aspects of the present disclosure.
Figure 1B:
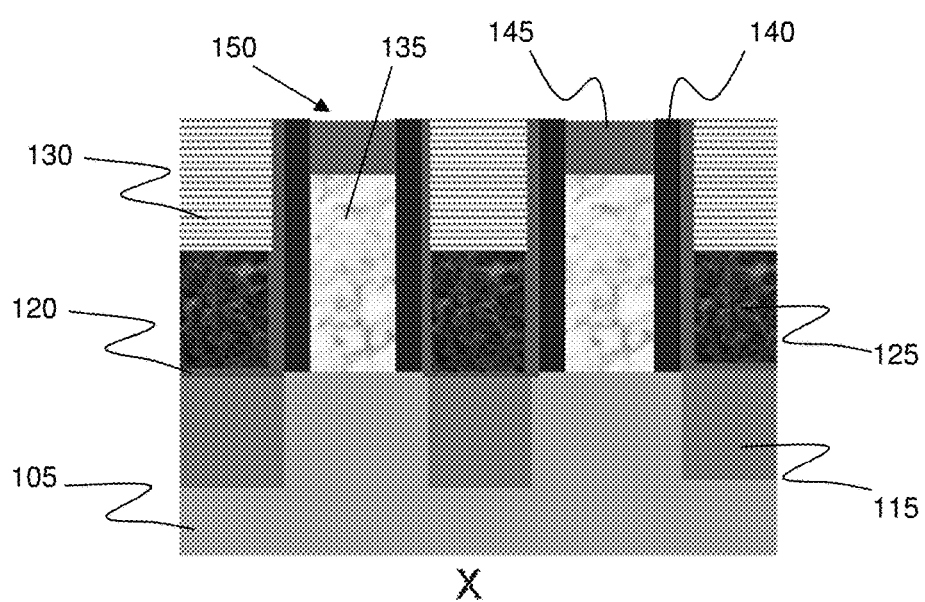
Figure 1C:
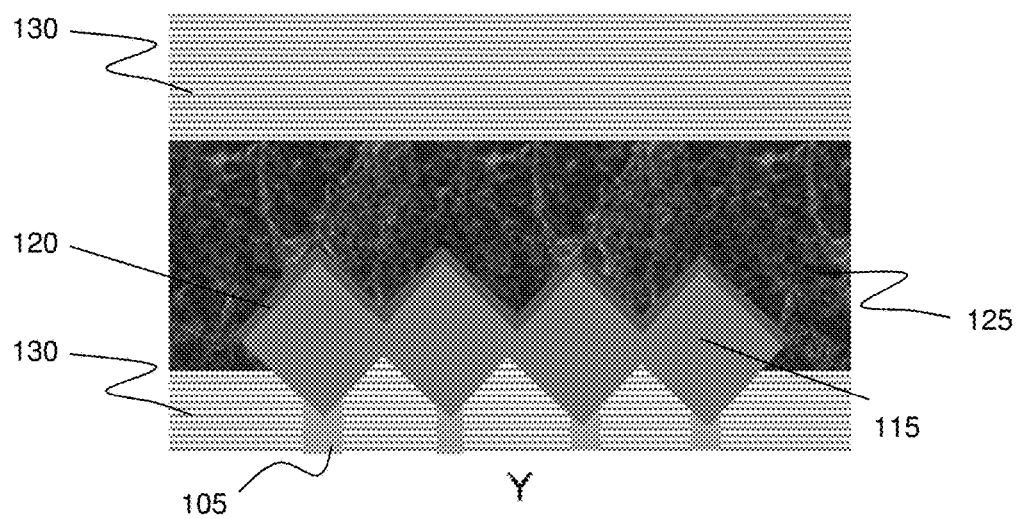

FIGS. 1A-1C show an incoming structure and respective fabrication processes in accordance with aspects of the present disclosure. More specifically, FIG. 1A shows a top view of a structure 100, while FIG. 1B shows a cross-sectional view in an X-axis direction and FIG. 1C shows a cross-sectional view in a Y-axis direction. The structure 100 comprises an active region 110, which can form a device, e.g., a transistor. The structure 100 further comprises a substrate 105 composed of a suitable semiconductor material. For example, the substrate 105 may be composed of any suitable material including, but not limited to, Si, SiGe, SiGeC, SiC, GaAs, InAs, InP, etc. In embodiments, the substrate 105 can be representative of a fin structure or a planar feature.

In embodiments, a fin structure can be fabricated using a sidewall image transfer (SIT) technique. In an example of a SIT technique, a mandrel material, e.g., $SiO_2$, is deposited on the substrate 105 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the narrow fin structures, for example. The mandrels are removed or stripped using a conventional etching process, selective to the mandrel material. An etching is then performed within the spacing of the spacers to form the sub-lithographic features. The sidewall spacers can then be stripped.

Gate structures 150 are formed on the substrate 105. As should be understood, the gate structures 150 can be planar gate structures or finFET gate structures. In either scenario, the gate structures 150 can be fabricated using any known gate formation processes, e.g., replacement gate fabrication processes known in the art. In this way, the gate structures 150 can be replacement gate structures. In embodiments, the gate fabrication process begins with dummy gate materials, e.g., poly-silicon (poly-Si), to form dummy gate structures. Source and drain (S/D) regions 115 are formed on the sides of the dummy gate structures, in the substrate 105 using, e.g., any conventional method. For example, the S/D regions 115 can be formed by an ion implantation process, doping process or through a diffusion processes, as is well known to those of skill in the art such that no further explanation is required for an understanding of the present disclosure. In further embodiments, the S/D regions 115 can be raised S/D regions formed by an epi growth on the surfaces of the substrate 105, between the dummy gate structures. In this way, the plurality of gate structures 150 comprise the S/D regions 115.

Sidewall spacers 140, e.g., a low-k dielectric, can be deposited on the sidewalls of the dummy gate materials. The sidewall spacers 140 can be deposited by conventional CVD processes followed by a patterning process, e.g., anisotropic etching process, to remove any material from horizontal surfaces of the structure. A liner 120 is deposited on sidewalls of sidewall spacers 140 of the dummy gate structures and over the S/D regions 115. In embodiments, the liner 120 can be deposited by chemical vapor deposition (CVD) processes. The liner 120 can be composed of any suitable material, e.g., SiN.

FIGS. 1B and 1C show an amorphous silicon (α-Si) material 125 deposited over the liner 120. In this way, the α-Si material 125 is over the S/D regions 115. The α-Si material 125 can be deposited by conventional deposition processes, e.g., CVD processes, followed by an etching. The α-Si material 125 is etched using a reactive ion etching (RIE) with chemistries that are selective to the α-Si material 125. In embodiments, the α-Si material 125 is recessed to a height in a range of about 10 nm-50 nm, for example. An interlevel dielectric (ILD) layer 130 is deposited in the recesses over the α-Si material 125. The ILD layer 130 can be comprised of any suitable dielectric material, e.g., oxide, deposited by a CVD process. The deposition of the ILD layer 130 is followed by a chemical mechanical polishing (CMP) process. In this way, an ILD layer is created with a bi-layer material: a bottom sacrificial layer, i.e., the α-Si material 125, and a top dielectric cap, i.e., the ILD layer 130. Specifically, an ILD layer comprises a sacrificial layer and a dielectric cap over the source and drain regions 115 of the gate structures 150.

The dummy gate materials, e.g., poly-Si, are stripped away, forming trenches and exposing the substrate 105. The dummy gate materials mandrels are removed or stripped using a conventional etching process, selective to the dummy gate materials. The gate structures 150 are formed within the trenches, on the substrate 105. In embodiments, the gate structures 150 include gate dielectric materials and metallization features. The gate dielectric materials can be, e.g., a high-k gate dielectric material, e.g., hafnium based dielectrics. In further embodiments, the high-k dielectric materials can include, but are not limited: $Al_2O_3$, $Ta_2O_3$, $TiO_2$, $La_2O_3$, $SrTiO_3$, $LaA_1O_3$, $ZrO_2$, $Y_2O_3$, $Gd_2O_3$, and combinations including multilayers thereof. The metallization features, i.e., the gate material 135, can include any workfunction metal or any combination of metals, depending on the particular application and design parameters. For example, in embodiments, the gate material 135 can be a tungsten (W) material, amongst other examples.

In embodiments, the gate material 135 is etched to form recesses in the gate structures 150. In this way, the gate structures 150 are recessed gate structures. The gate material 135 can be etched using selective etching processes to the gate material 135, e.g., a wet etch process. A capping material 145 is deposited within the recesses over the gate material 135, e.g., using a CVD process followed by a CMP process. The capping material 145 can be any suitable capping material, e.g., SiN, amongst other examples.

Figure 2A:
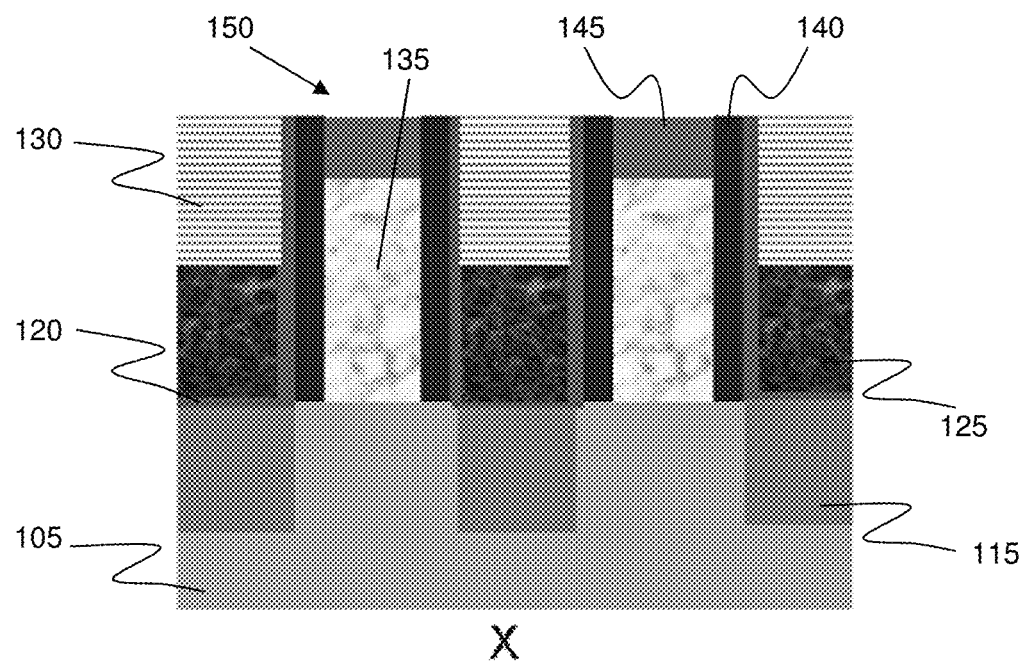
FIGS. 2A and 2B show shallow trench isolation regions, amongst other features, and respective fabrication processes in accordance with aspects of the present disclosure.
Figure 2B:
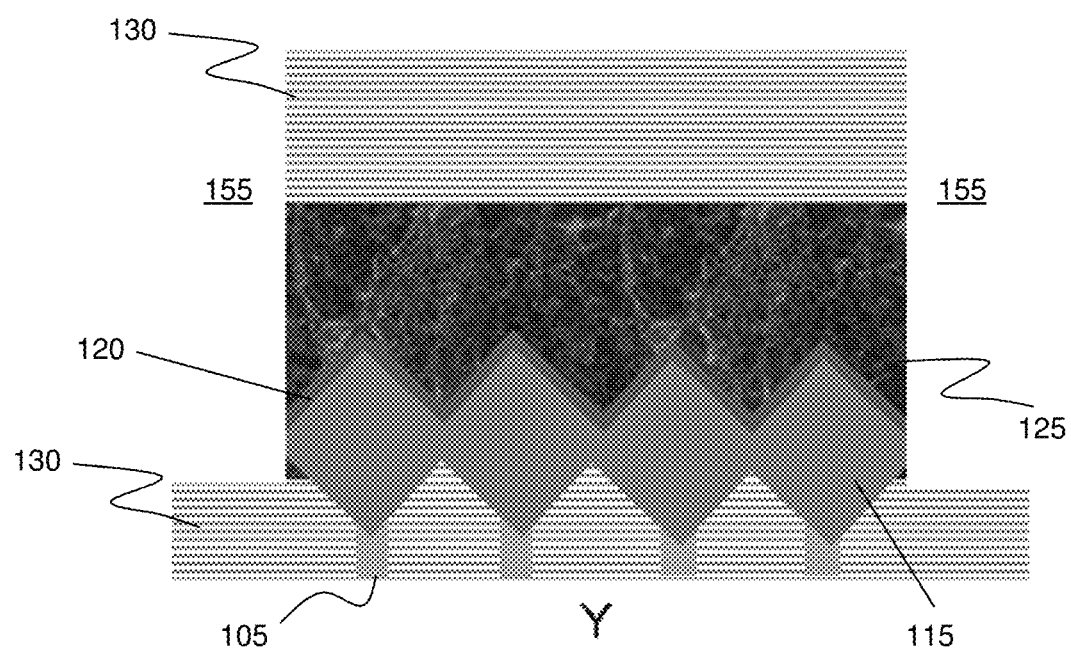

FIGS. 2A and 2B show the formation of shallow trench isolation (STI) regions in the ILD layer 130. In embodiments, trenches 155 are formed in the ILD layer 130 using conventional lithography and etching techniques, e.g., RIE process. For example, a resist formed over the ILD layer 130 is exposed to energy (light) to form a pattern (opening). An etching process with a selective chemistry, e.g., RIE, will be used to form one or more trenches 155 in the ILD layer 130 through the openings of the resist. The resist can then be removed by a conventional oxygen ashing process or other known stripants.

Figure 3A:
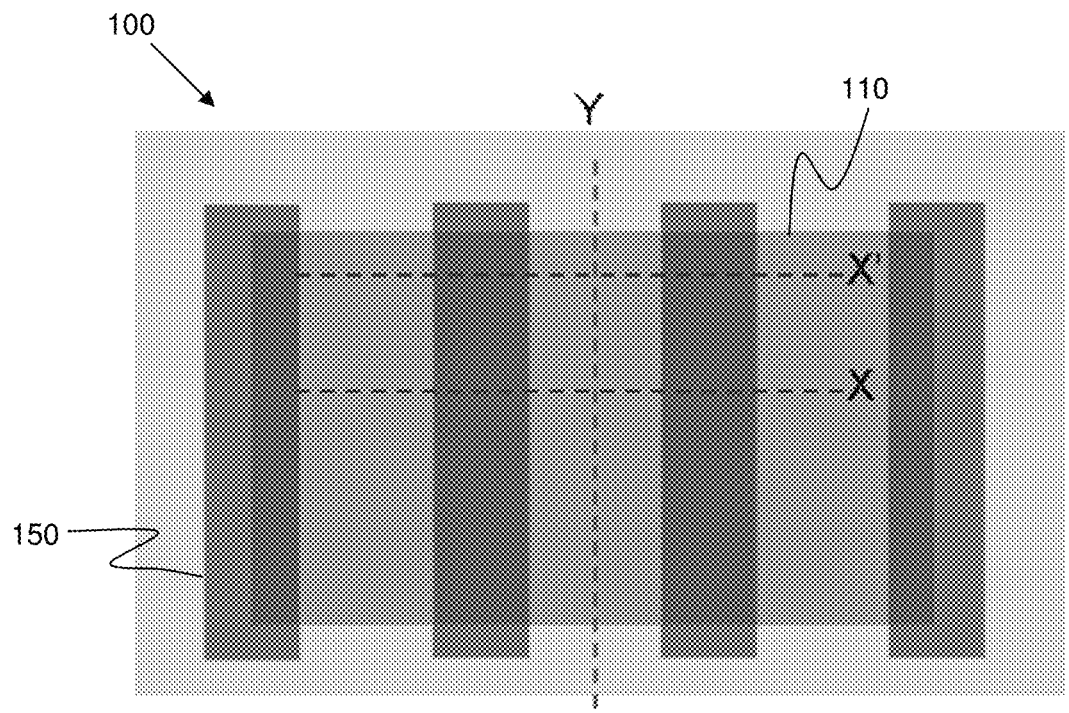
FIGS. 3A-3D show shallow trench isolation structures, amongst other features, and respective fabrication processes in accordance with aspects of the present disclosure.
Figure 3B:
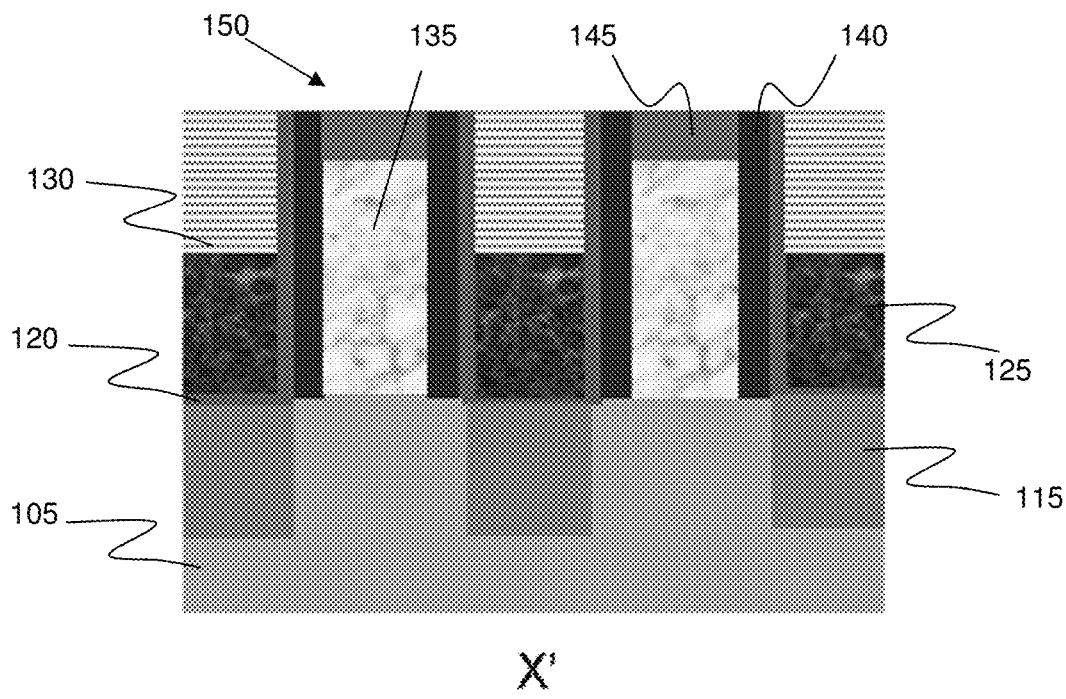
Figure 3C:
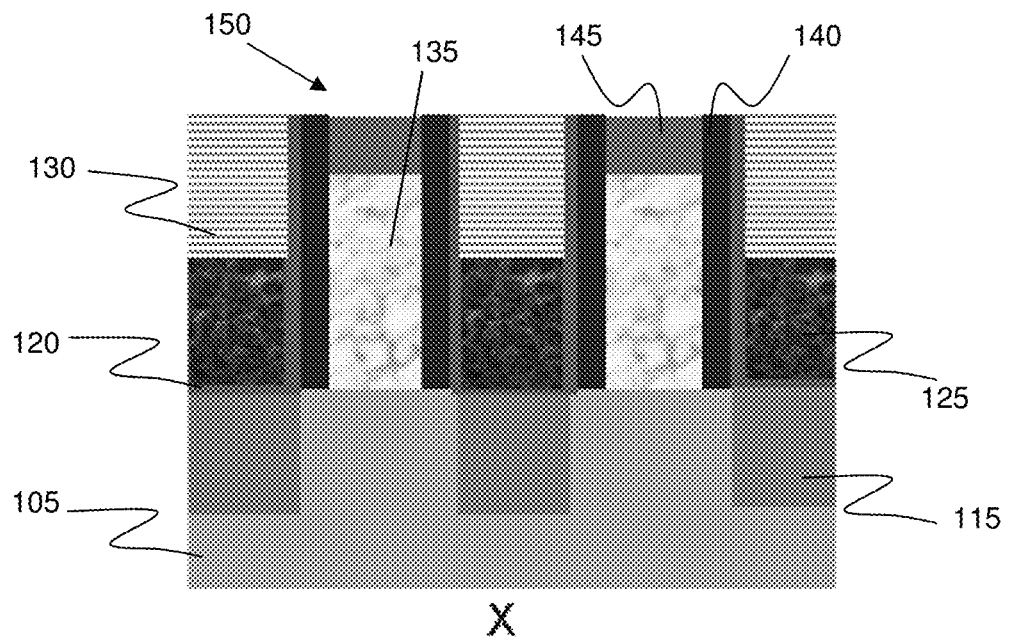
Figure 3D:
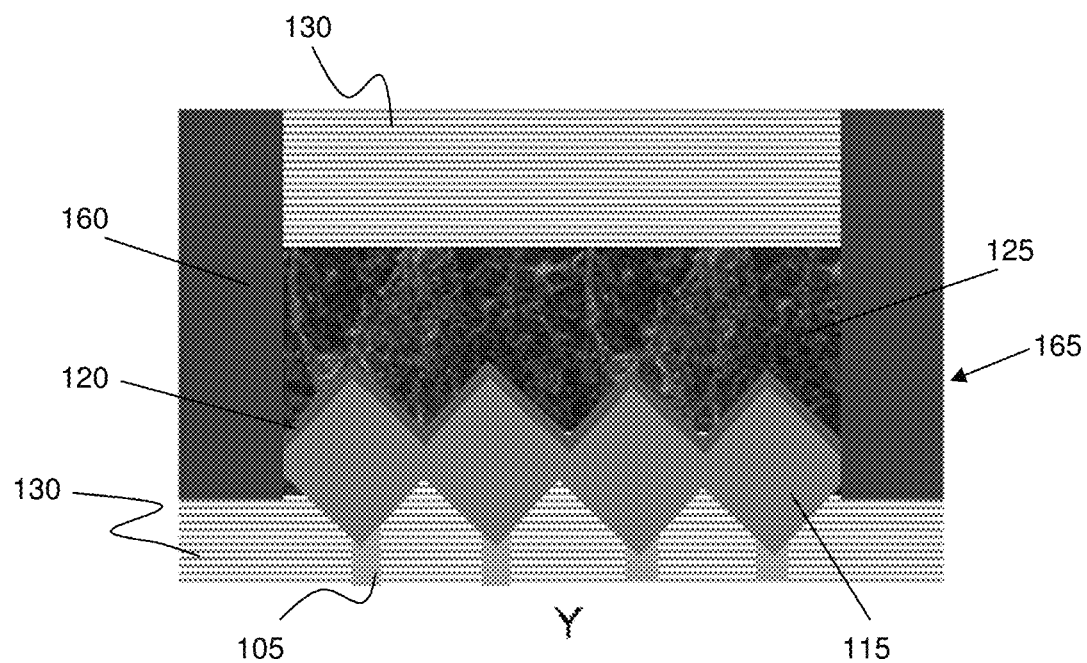

FIGS. 3A-3D illustrate the structure 100 with an additional cross-sectional view. Specifically, FIG. 3A shows a top view of the structure 100 and FIGS. 3B and 3C show a cross-sectional view in an X-axis direction, and FIG. 3D shows a cross-sectional view in a Y-axis direction. FIG. 3D shows the trenches 155 filled with a dielectric material 160 to form STI structures 165. In embodiments, the dielectric material 160 can be comprised of a low-k dielectric material, e.g., SiOC, amongst other examples. The deposition of the dielectric material 160 is by a CVD process, followed by a CMP process.

Figure 4A:
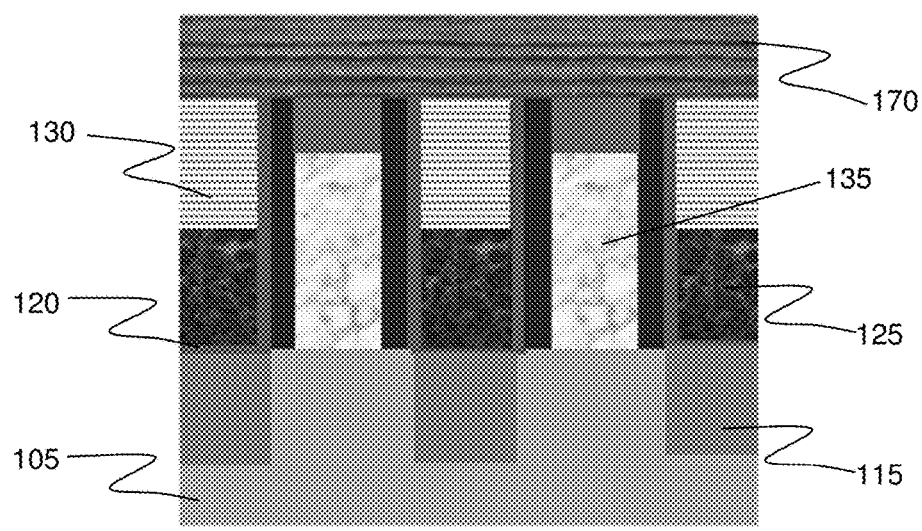
FIGS. 4A-4C show structures having exposed amorphous silicon, amongst other features, and respective fabrication processes in accordance with aspects of the present disclosure.
Figure 4B:
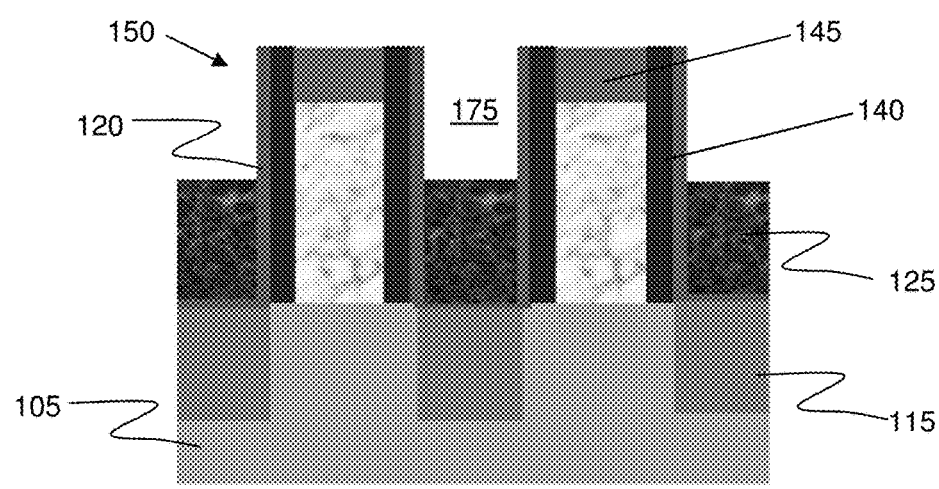
Figure 4C:
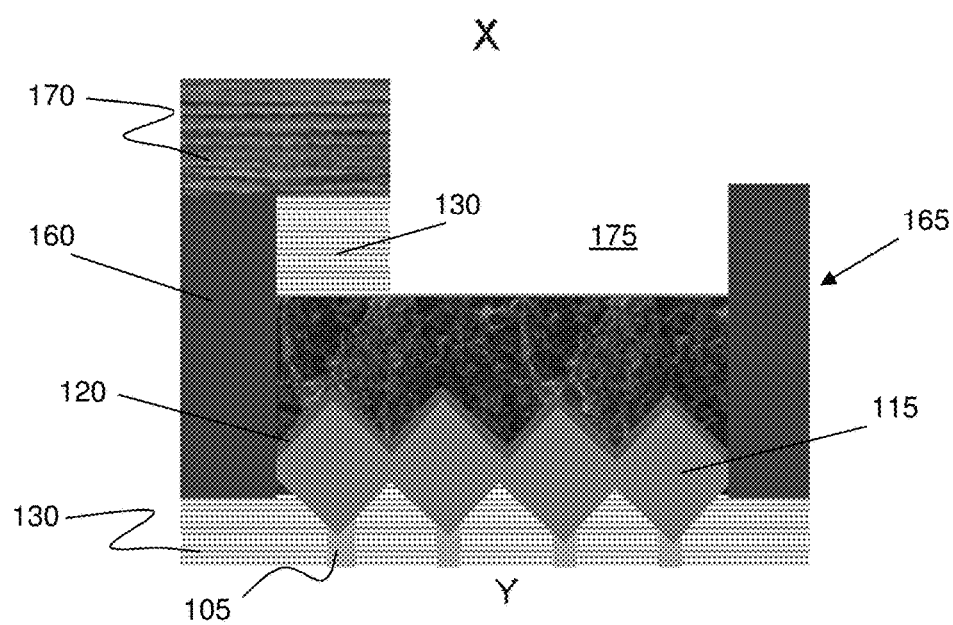

FIGS. 4A-4C show a photoresist 170 formed over the STI structures 165 and the ILD layer 130. In embodiments, the photoresist 170 is exposed to energy (light) to form a pattern (opening). An etching process with a selective chemistry, e.g., RIE process, will be used to form one or more trenches 175 in the ILD layer 130 through the openings of the photoresist 170, exposing the α-Si material 125. Specifically, FIG. 4C shows opening a portion of the dielectric cap, i.e., ILD layer 130, to expose the sacrificial layer, i.e., the α-Si material 125. As shown in FIGS. 4A and 4C, portions of the ILD layer 130 remain, adjacent to the dielectric material 160.

Figure 5A:
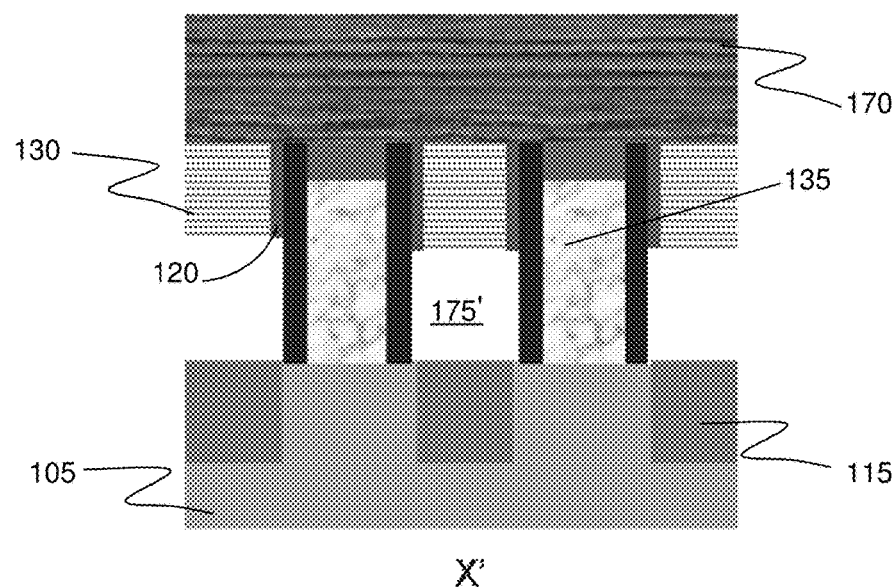
FIGS. 5A-5C show structures having exposed source and drain regions, amongst other features, and respective fabrication processes in accordance with aspects of the present disclosure.
Figure 5B:
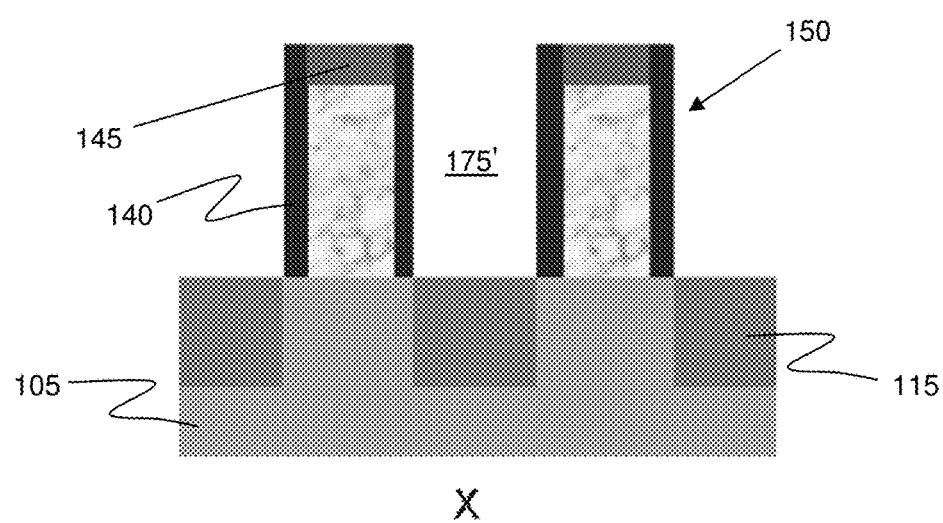
Figure 5C:
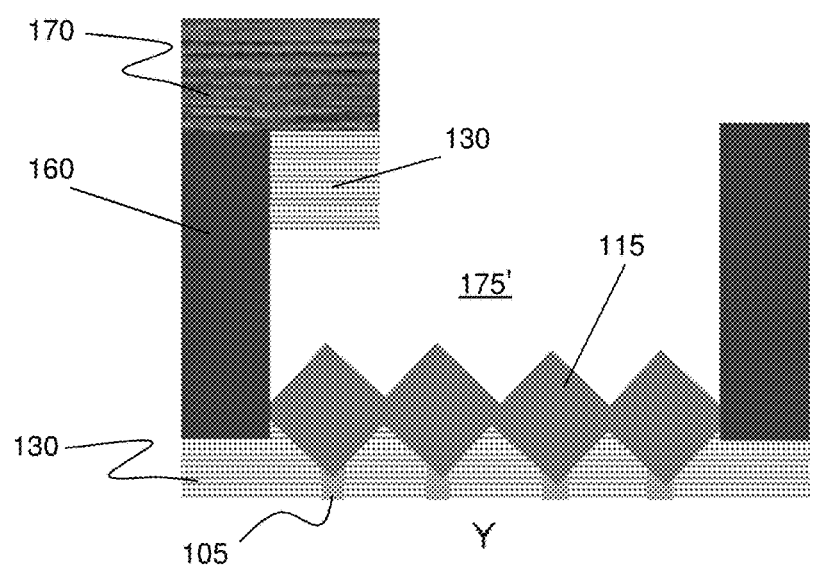

FIGS. 5A-5C show the removal of the α-Si material 125, forming the trenches 175' to expose the source and drain (S/D) regions 115. The α-Si material 125 can be removed by conventional etching processes, e.g., wet etch process. In embodiments, the etching of α-Si material 125 can be with or without the photoresist 170. In embodiments, the etching of the α-Si material 125 is not directional, leaving portions of the ILD layer 130 in the X-axis direction and the Y-axis direction, as shown in FIGS. 5A and 5C. The photoresist 170 can be removed by a conventional oxygen ashing process or other known stripants.

Figure 6A:
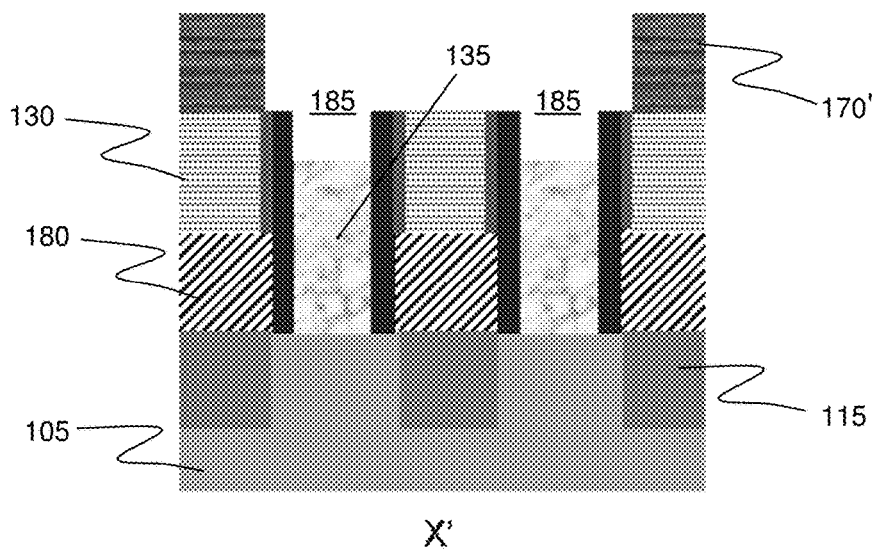
FIGS. 6A-6C show dummy fill materials, amongst other features, and respective fabrication processes in accordance with aspects of the present disclosure.
Figure 6B:
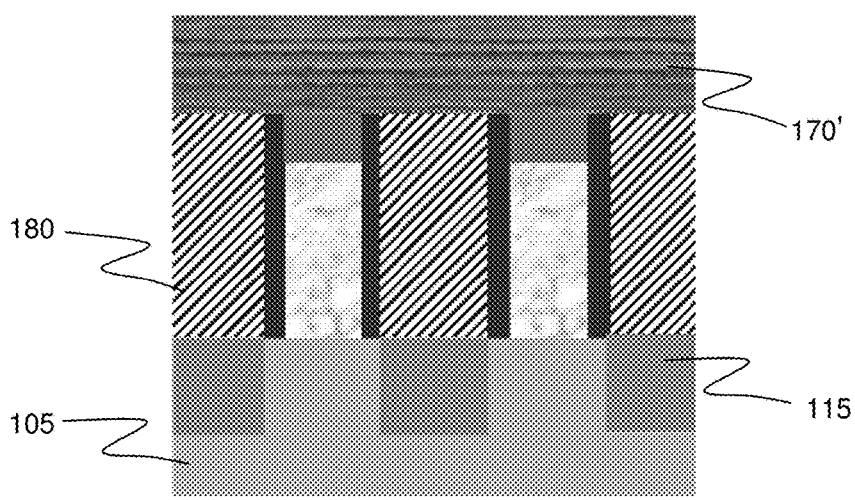
Figure 6C:
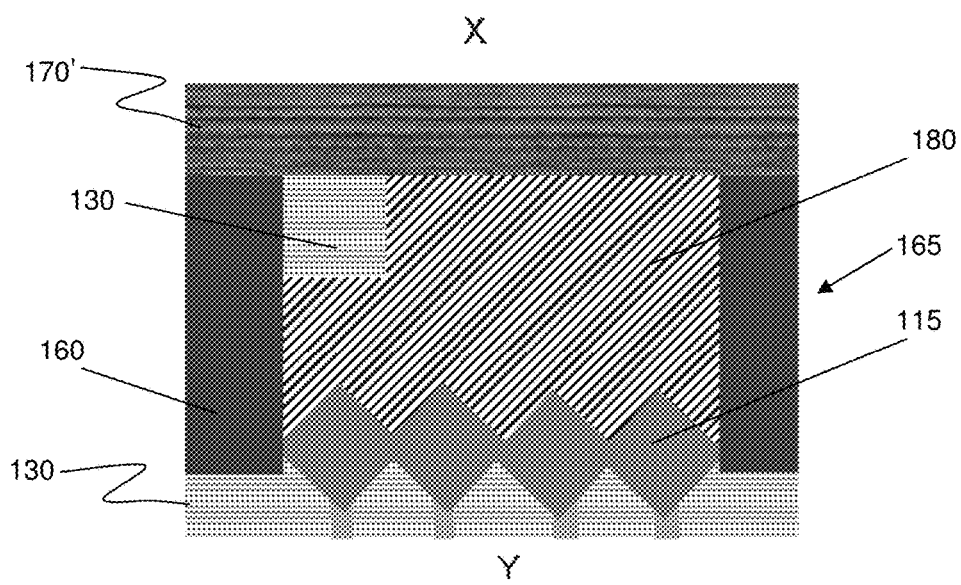

FIGS. 6A-6C show the filing of the trenches 175' with a sacrificial material 180. In embodiments, the sacrificial material 180 can be SOH, amorphous carbon (α-C) or an organic planarization layer (OPL), amongst other examples. The sacrificial material 180 is used to create a flat surface for the deposition of the photoresist 170', which will be used to etch the capping material 145 of the gate structures 150 (in the X-axis direction in subsequent processes). In embodiments, the photoresist 170' is formed over the STI structures 165, the ILD layer 130 and the sacrificial material 180. The photoresist 170' is exposed to energy (light) to form a pattern (opening). An etching process with a selective chemistry, e.g., RIE, will be used to remove the capping material 145 through the openings of the resist, thereby forming one or more trenches 185 of the gate material 135 of the gate structures 150 in the X-axis direction. Specifically, FIG. 6A shows exposing the gate materials 135 of the gate structures 150. The photoresist 170' can be removed by a conventional oxygen ashing process or other known stripants, while the sacrificial material 180 can be removed by a selective etching. The removal of the capping material 145, i.e., the gate cap, is for the subsequent formation of gate contacts to the gate structures 150.

Figure 7A:
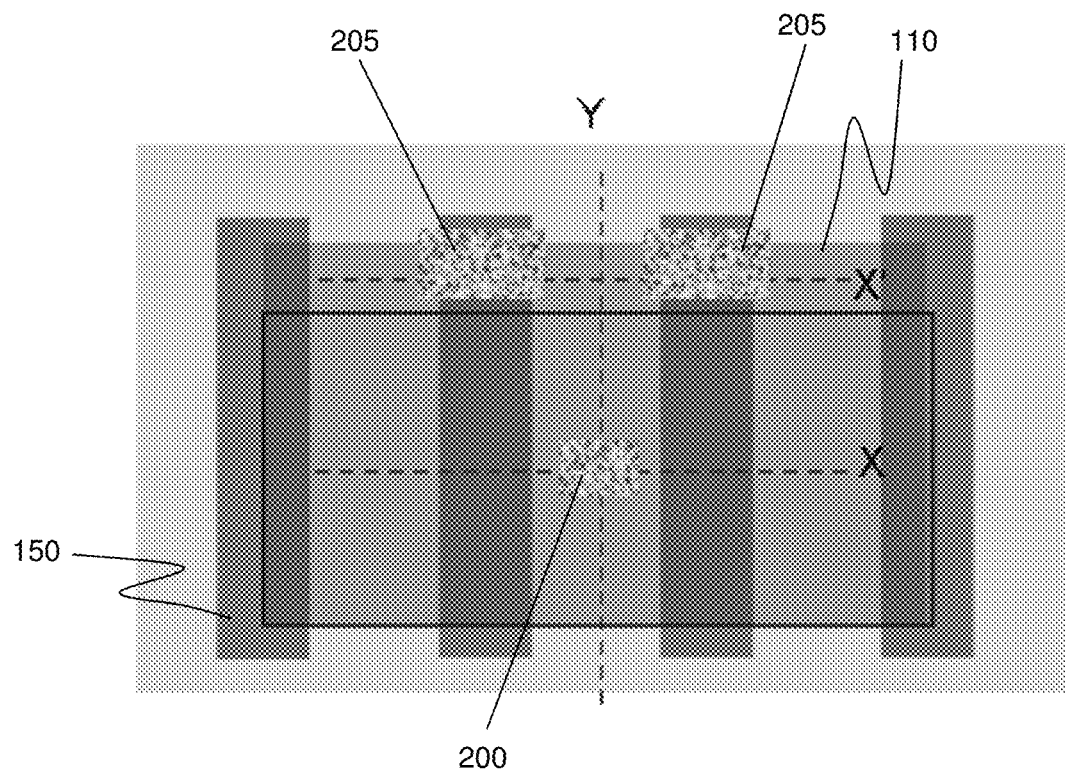
FIGS. 7A-7D show gate contacts and source and drain contacts, amongst other features, and respective fabrication processes in accordance with aspects of the present disclosure.
Figure 7B:
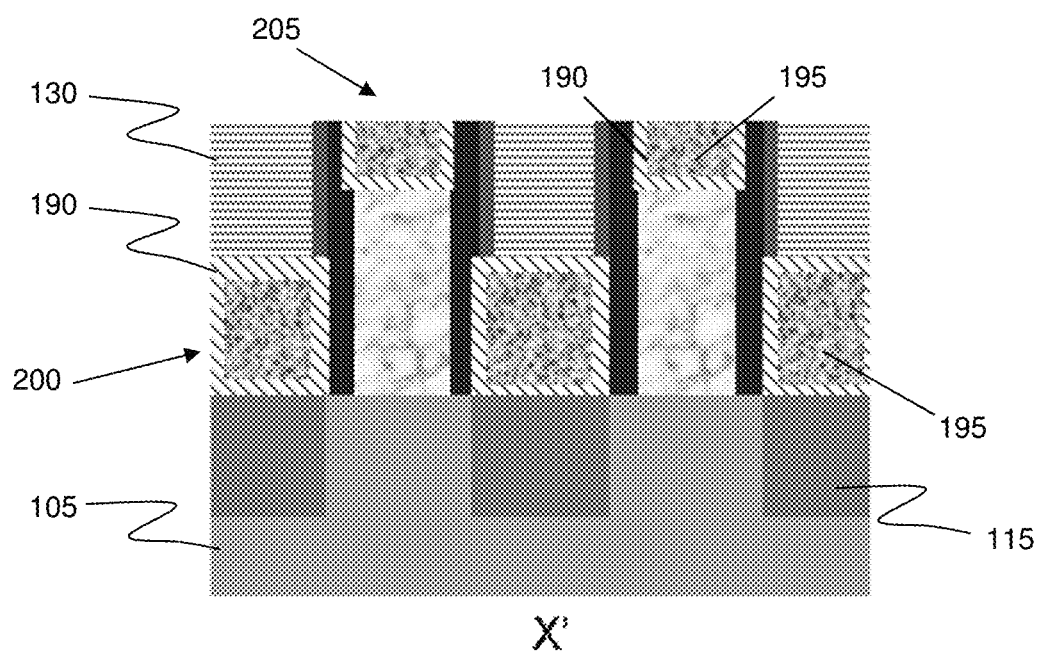
Figure 7C:
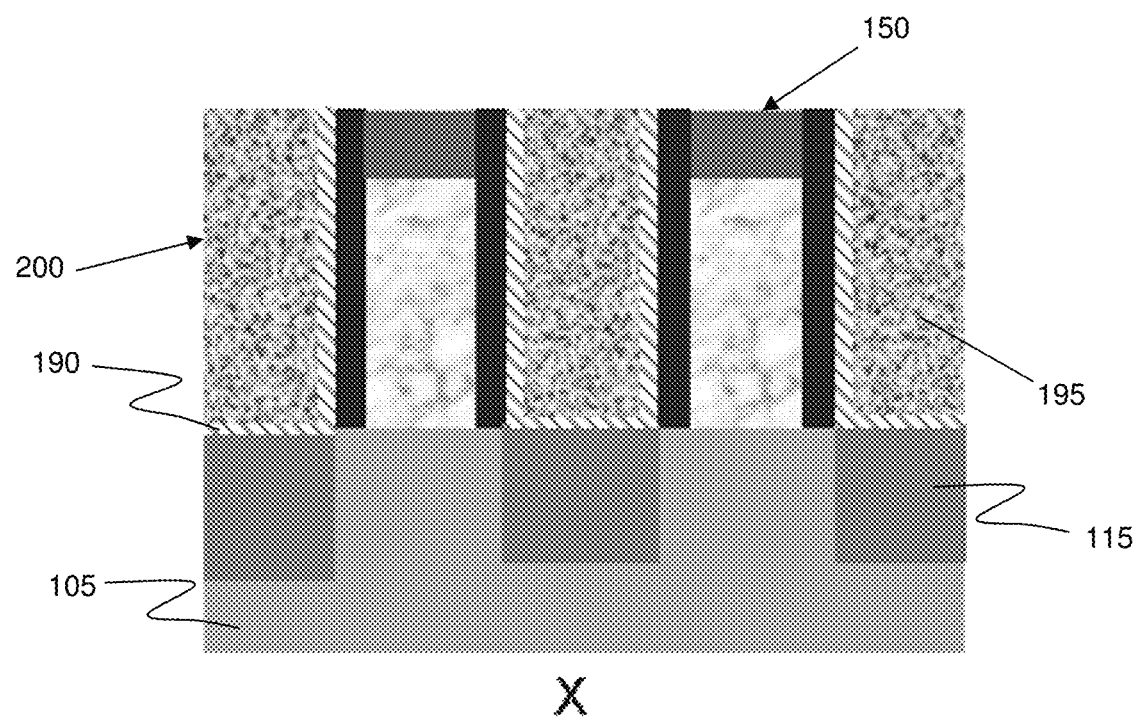
Figure 7D:
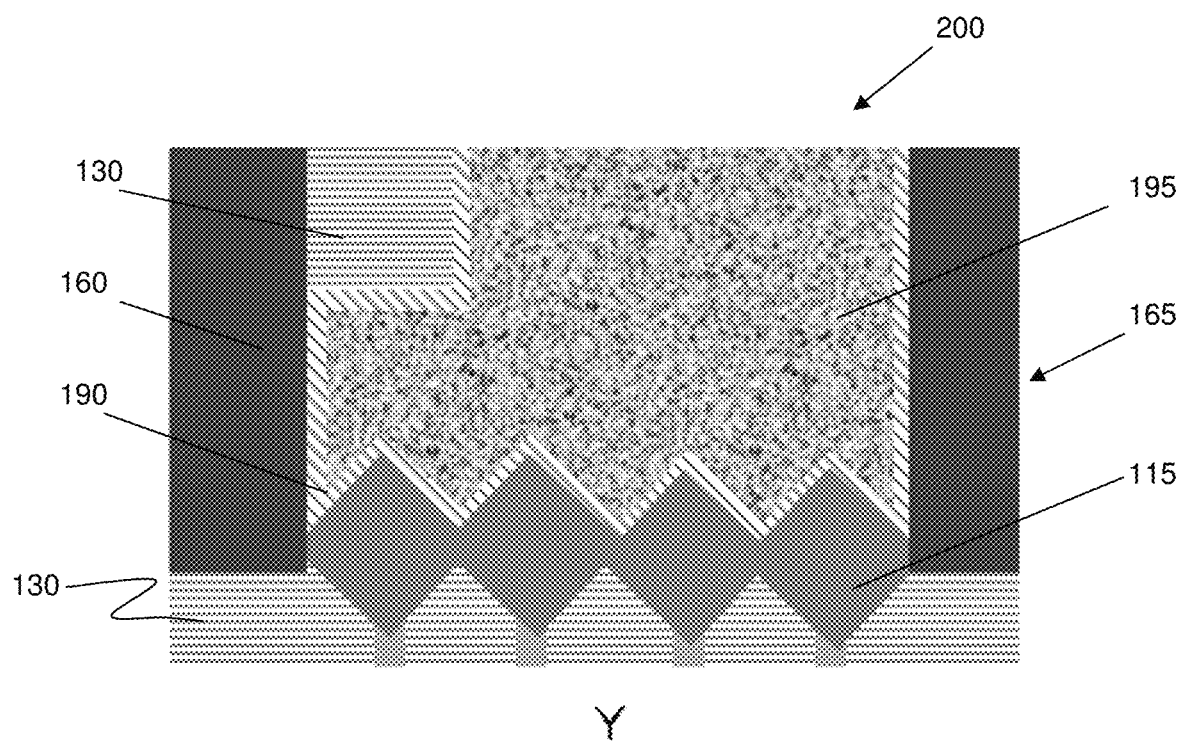

FIGS. 7A-7D show source and drain and gate metallization features, amongst other features, and respective fabrication processes in accordance with aspects of the present disclosure. Specifically, a silicide liner 190 is deposited in the trenches 185 (over the gate structures 150 and particularly the gate materials 135) and over the S/D regions 115. Specifically, FIG. 7B shows depositing a liner 190 on the exposed gate materials 135 and the exposed source and drain regions 115 prior to forming the metallization features. The liner 190 is subjected to a silicide process. The liner 190 can be deposited using physical vapor deposition (PVD) or CVD processes. The liner 90 can be Ti, TiN, TaN, Ru and Co, amongst other examples. Following the silicide process, a metal material 195 is deposited on the liner 190 to form source and drain contacts 200 and the gate contacts 205. In this way, the source and drain contacts 200 and gate contacts 205 are formed at the same time by the same metal material 195.

The metal material 195 can be deposited by CVD processes, and can be any suitable conductive material. For example, the metal material 195 can be tungsten (W), cobalt (Co) or copper (Cu), for example. The deposition of the metal material 195 is followed by a CMP process. The source and drain contacts 200 connect to the S/D regions 115, while the gate contacts 205 connect to the gate structures 150. In this way, the gate contacts 205 of the gate structures 150 comprise a liner 190 and a fill material, i.e., metal material 195. Further, the liner 190 is over the S/D regions 115, the gate materials 135, the gate contacts 205 and the at least one source and drain contact.

As shown in FIG. 7A, the source and drain contacts 200 are offset from the gate contacts 205 in both the X-axis direction and the Y-axis direction. In this way, the gate contacts 205 connecting to the gate structures 150 are offset from the source and drain contacts 200 connecting to the S/D regions 115. Particularly, the gate contacts 205 of the gate structures 150 are offset from the source and drain contacts 200 of the S/D regions 115 in an X-axis direction and a Y-axis direction. Specifically, FIG. 7B shows forming offset metallization features, i.e., the contacts 200, 205, at the same time on the exposed gate materials 135 and the exposed S/D regions 115. Further, as shown in FIG. 7B, the source and drain contact 200 is at a height different than the gate contacts 205. Specifically, the source and drain contact 200 is at a lower height than the gate contacts 205, so that at least one source and drain contact 200 is at a different height with respect to the gate contacts 205. In this way, the gate contacts 205 of the gate structures 150 are at a different height than the source and drain contacts 200 of the S/D regions 115.

Figure 8A:
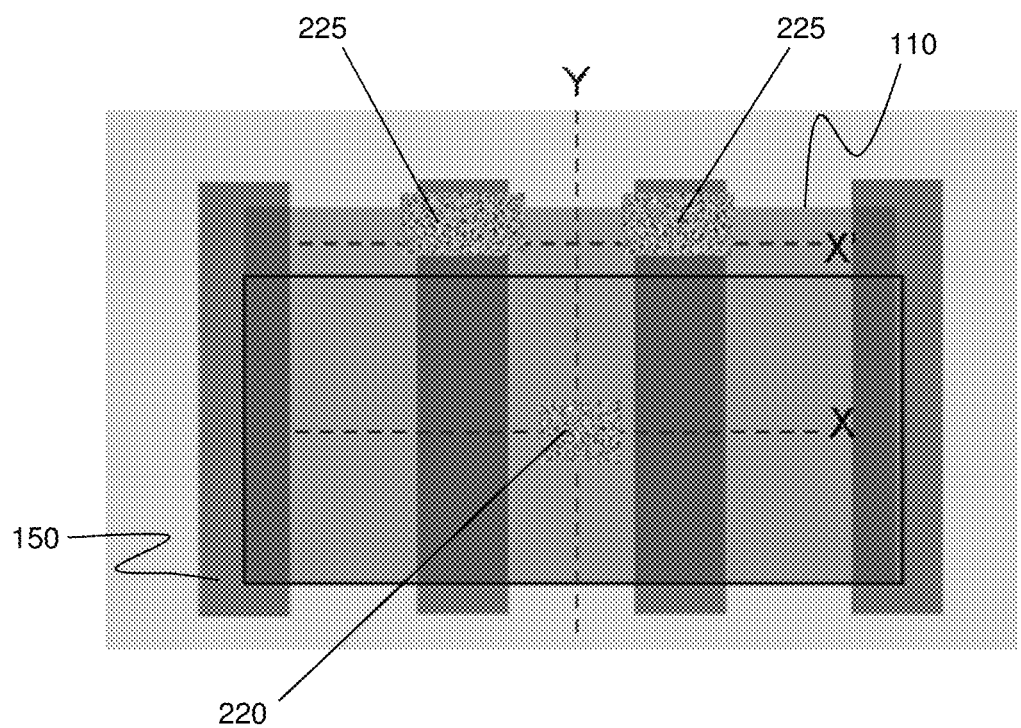
FIGS. 8A-8D show interconnect structures, amongst other features, and respective fabrication processes in accordance with aspects of the present disclosure.
Figure 8B:
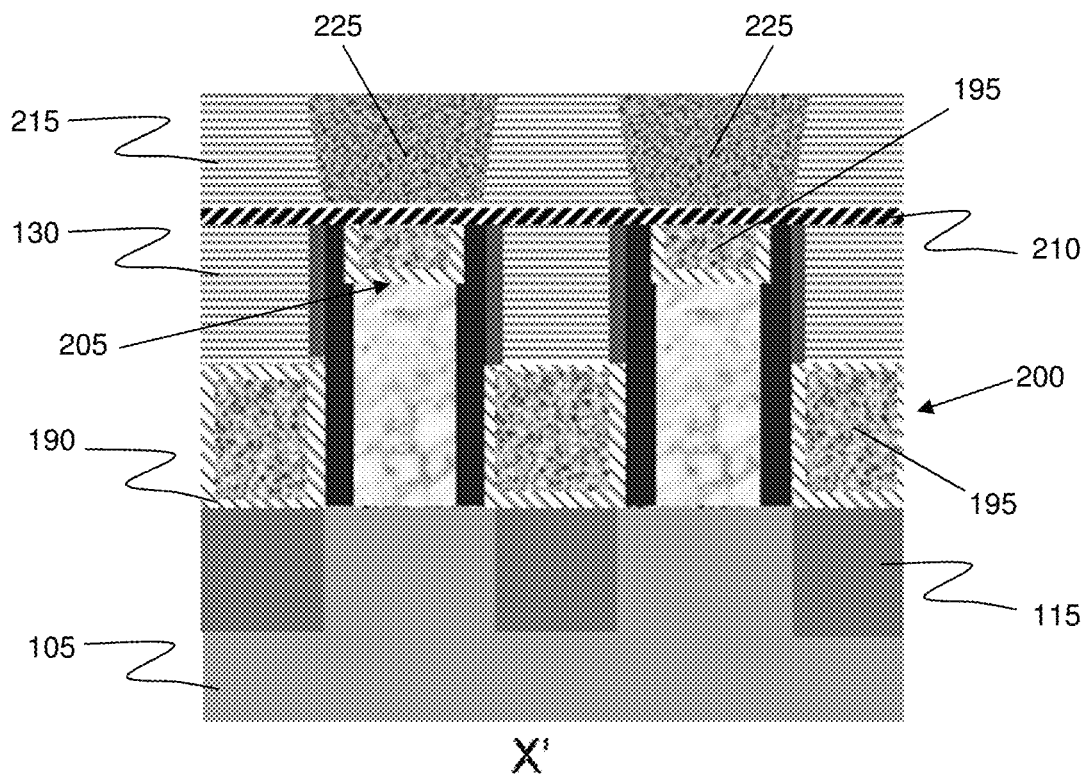
Figure 8C:
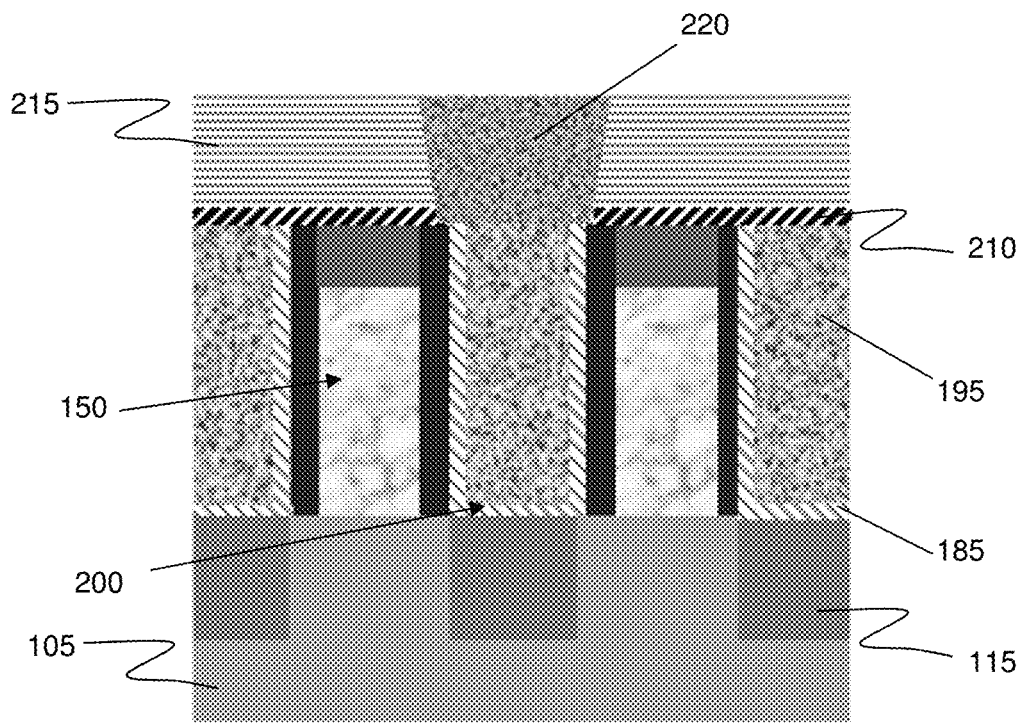
Figure 8D:
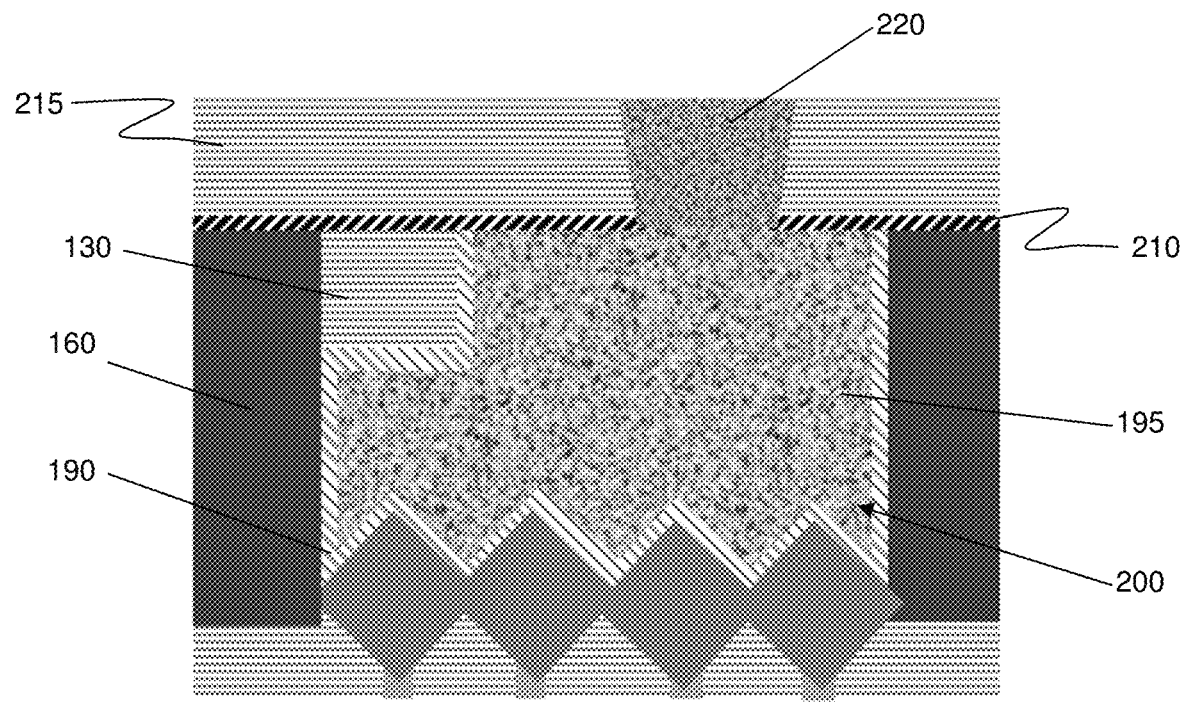

In embodiments, the source and drain contact 200 is step shaped, with a dielectric cap, i.e., the ILD layer 130, over it. Specifically, the at least one source and drain contact 200 is step shaped. In this way, the liner 190 will directly contact the S/D regions 115, e.g., silicide of the S/D regions 115, the sidewall spacers 140 of the gate structures 150 and under the dielectric cap over the source and drain contact 200. Specifically, as shown in FIG. 8B, the ILD layer 130 forms the dielectric cap over the source and drain contacts 200. Specifically, the dielectric cap comprises an oxide material, i.e., the oxide of the ILD layer 130, and the liner 120.

The structures and processes described herein provide the benefit of preventing shorts in smaller technology nodes. Specifically, shorts are prevented by having the source and drain contact 200 and the gate contacts 205 formed at the same time by the metal material 195, but at different heights and being offset from one another.

FIGS. 8A-8D show the formation of metallization features (e.g., interconnect contact structures) extending from the source and drain contacts 200 and the gate contacts 205. Specifically, an etch stop layer 210 is deposited over the ILD layer 130 and the gate contacts 205. In embodiments, the etch stop layer 210 is deposited by CVD process, and can be composed of nitride material, e.g., SiN. An ILD layer 215 is deposited over the etch stop layer 210 by, e.g., a CVD processes. In embodiments, the ILD layer 215 can be composed of an oxide material, for example. Following the deposition of the ILD layer 215, a CMP process is performed.

Interconnect structures 220, 225 extending from the contacts 200, 205 can be formed using conventional lithography and etching processes, e.g., a RIE process. For example, a resist formed over the ILD layer 215 is exposed to energy (light) to form a pattern (opening). An etching process with a selective chemistry, e.g., reactive ion etching (RIE), will be used to form one or more trenches in the ILD layer 215 through the openings of the resist. The resist can then be removed by a conventional oxygen ashing process or other known stripants.

The removal of the resist is followed by the deposition of a conductive material by conventional deposition processes, e.g., CVD processes, to form the interconnect structures 220, 225. Any residual conductive material on the surface of the ILD layer 215 can be removed by conventional CMP processes. The conductive material used to form the interconnect structures 220, 225 can be any suitable conductive material, e.g., tungsten (W). In embodiments, the interconnect structures 220 are in direct electrical contact with the source and drain contacts 200, while the interconnect structures 225 are in direct electrical contact with the gate contacts 205. In this way, the interconnect structures 220, 225 are in electrical contact with the contacts of the gate structures 150 and the contacts of the source and drain regions (S/D) 115. FIG. 8B shows forming offset contacts, i.e., the interconnect structures 220, 225, extending from the metallization features, i.e., the contacts 200, 205. Additionally, FIG. 8B shows that the plurality of gate structures 150 comprise source and drain regions 115, the gate materials 135, the gate contacts 205 and the interconnect structures 225 extending from the gate contacts 205.

It should now be understood that the processes and resultant structures described herein will serve to further protect the gate metal of the gate structure during MOL processes. The resultant structures, e.g., sidewall structures, will hence prevent shorts occurring from occurring with interconnect or other wiring structures of the source/drain regions. Accordingly, the processes and structures described herein will increase yield.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of gate structures comprising source and drain regions and spacers;
   contacts connecting to the source and drain regions;
   a silicide liner covering the source and drain regions and positioned between sidewalls of the contacts connecting to the source and drain regions and sidewalls of the gate structures;
   contacts connecting to the gate structures which are offset from the contacts connecting to the source and drain regions;
   interconnect structures in electrical contact with the contacts of the gate structures and the contacts of the source and drain regions; and
   an etch stop layer between the contacts connecting to the gate structures and the interconnect structures.

2. The structure of claim 1, wherein the contacts of the gate structures comprise a liner and a fill material.

3. The structure of claim 2, wherein the liner is TiN.

4. The structure of claim 3, wherein the TiN liner is over the source and drain regions.

5. The structure of claim 4, wherein the fill material is cobalt or tungsten.

6. The structure of claim 1, wherein the contacts of the gate structures are at a different height than the contacts of the source and drain regions.

7. The structure of claim 1, wherein the contacts of the gate structures are offset from the contacts of the source and drain regions in an X-axis direction.

8. The structure of claim 1, wherein the contacts of the gate structures are offset from the contacts of the source and drain regions in a Y-axis direction.

9. The structure of claim 1, further comprising a dielectric cap over the contacts of the source and drain regions.

10. The structure of claim 9, wherein the dielectric cap comprises an oxide material and a liner.

11. The structure of claim 10, wherein the liner is comprised of a nitride material.

12. The structure of claim 1, wherein the gate structures are replacement gate structures.

13. The structure of claim 1, wherein the gate structures are recessed gate structures.

14. The structure of claim 13, further comprising:
   a bottom dielectric layer below the etch stop layer;
   a top dielectric layer over the etch stop layer, wherein the bottom dielectric layer forms a dielectric cap over the contacts connecting to the source and drain regions.

15. The structure of claim 14, further comprising an additional liner adjacent to the gate structures and over the silicide liner, wherein the additional liner directly contacts the etch stop layer, the bottom dielectric layer directly contacts the etch stop layer, the silicide liner and the additional liner, and the interconnect structures are formed within the top dielectric layer.

16. A structure, comprising:
   a plurality of gate structures comprising spacers, source and drain regions, gate contacts and interconnect structures extending from the gate contacts;
   at least one source and drain contact at a different height with respect to the gate contacts;
   a silicide liner covering the source and drain regions and the at least one source and drain contact, the silicide liner positioned between sidewalls of the at least one source and drain contact and sidewalls of the spacers; and an etch stop layer over the liner and between the gate contacts and the interconnect structures.

17. The structure of claim 16, wherein the at least one source and drain contact is offset from the gate contacts in either an X-axis or Y-axis direction.

18. The structure of claim 16, wherein the at least one source and drain contact is step shaped.

19. The structure of claim 18, further comprising a dielectric cap over the at least one source and drain contact.

20. The structure of claim 16, wherein the liner is comprised of a TiN material.

* * * * *